United States Patent
Yamamoto

(10) Patent No.: US 9,063,406 B2
(45) Date of Patent: Jun. 23, 2015

(54) EXPOSURE APPARATUS AND A METHOD OF MANUFACTURING A DEVICE THAT CONDUCT EXPOSURE USING A SET LIGHT SOURCE SHAPE

(75) Inventor: Tetsuya Yamamoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1036 days.

(21) Appl. No.: 12/407,310

(22) Filed: Mar. 19, 2009

(65) Prior Publication Data
US 2009/0257038 A1    Oct. 15, 2009

(30) Foreign Application Priority Data
Apr. 9, 2008   (JP) .................. 2008-101815

(51) Int. Cl.
G03B 27/42    (2006.01)
G03B 27/72    (2006.01)
G03F 7/20     (2006.01)

(52) U.S. Cl.
CPC ............ G03B 27/72 (2013.01); G03F 7/70116 (2013.01)

(58) Field of Classification Search
CPC .............. F21K 9/00; F21K 9/135; F21K 9/58
USPC ..................................... 355/53, 67
See application file for complete search history.

(56) References Cited

U.S. PATENT DOCUMENTS 5,965,308 A  * 10/1999 Ozawa ............................ 430/30
6,813,004 B1 * 11/2004 Horikoshi et al. .............. 355/69
2005/0219493 A1   10/2005 Oshida et al.
2005/0222699 A1 * 10/2005 Kemmoku ..................... 700/100
2005/0226000 A1 * 10/2005 Bader et al. .................... 362/554
2008/0037119 A1 *  2/2008 Miyazawa ..................... 359/453

FOREIGN PATENT DOCUMENTS

| | | |
|---|---|---|
| JP | 2002-231613 A | 8/2002 |
| JP | 2004-274011 A | 9/2004 |
| JP | 2006-19412 | 1/2006 |
| JP | WO 2006/004135 | 1/2006 |
| KR | 10-0703110 B1 | 3/2007 |

OTHER PUBLICATIONS

Korean Office Action dated Jan. 26, 2011, which issued in counterpart Korean patent application No. 10-2009-0030868.
Japanese Office Action dated Aug. 3, 2012, issued in counterpart Japanese Patent Application No. 2008-101815.

* cited by examiner

Primary Examiner — Mesfin T Asfaw
(74) Attorney, Agent, or Firm — Fitzpatrick, Cella, Harper & Scinto

(57) ABSTRACT

An exposure apparatus that exposes a substrate to light having a set light source shape via a mask. The apparatus includes a plurality of light sources arrayed two-dimensionally. A light source control unit controls turning on and off of each of the plurality of light sources based on turning on and off information corresponding to the set light source shape by referring to a plurality of kinds of information on light source shapes, in which the plurality of light sources are arrayed two-dimensionally, and turning on and off information corresponding to the plurality kinds of information on the light source shapes.

10 Claims, 13 Drawing Sheets

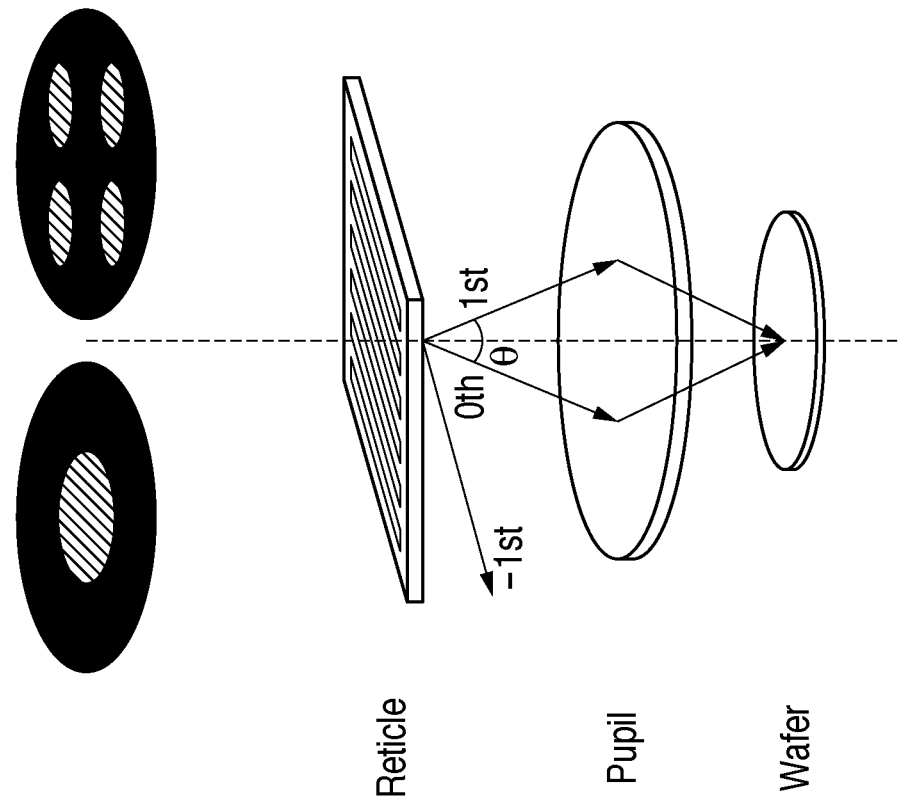
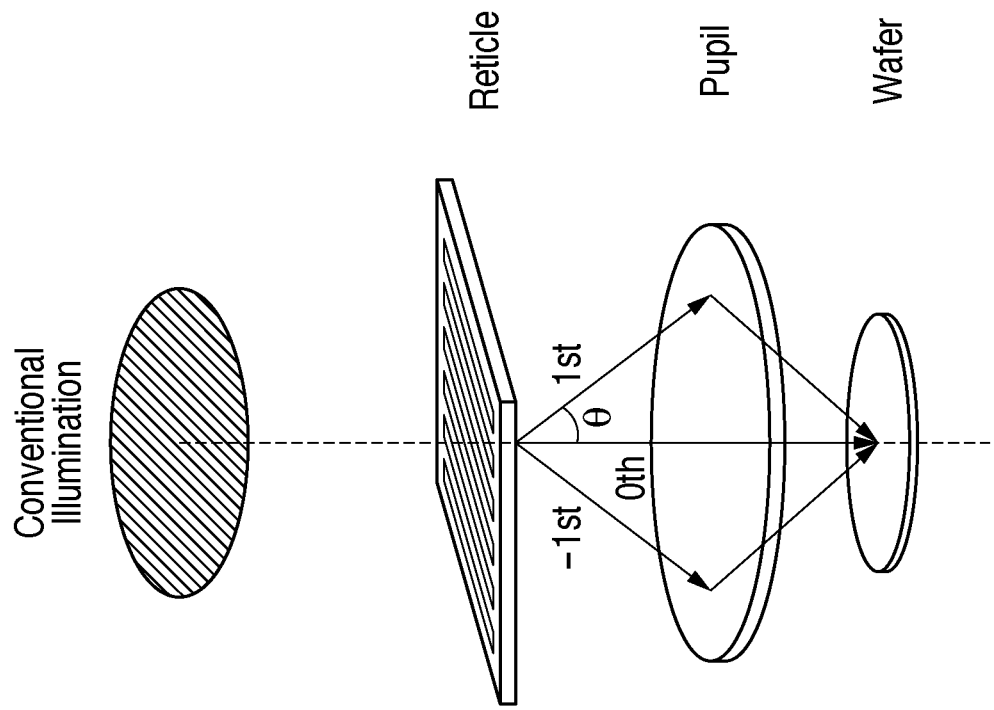

FIG. 11

| ILLUMINATION MODE | TYPE OF RETICLE | LED TURNING ON AND OFF COMMANDS |
| --- | --- | --- |
| HIGH-σ ILLUMINATION | RETICLE29 | DATA 1 |
| LOW-σ ILLUMINATION | RETICLE16 | DATA 2 |
| QUADRUPOLE ILLUMINATION A | RETICLE1 | DATA 3 |
| QUADRUPOLE ILLUMINATION B | RETICLE5 | DATA 4 |
| QUADRUPOLE ILLUMINATION C | RETICLE4 | DATA 5 |
| ANNULAR ILLUMINATION A | RETICLE63 | DATA 17 |
| ANNULAR ILLUMINATION B | RETICLE2 | DATA 18 |
| ANNULAR ILLUMINATION C | RETICLE70 | DATA 19 |
| ○○ ILLUMINATION A | | DATA 32 |
| ○○ ILLUMINATION B | RETICLE25 | DATA 33 |
| ○○ ILLUMINATION C | RETICLE70 | DATA 34 |
| △△ ILLUMINATION A | RETICLE33 | DATA 55 |
| △△ ILLUMINATION B | RETICLE6 | DATA 56 |
| △△ ILLUMINATION C | RETICLE9 | DATA 57 |
| ◇◇ ILLUMINATION A | RETICLE52 | DATA 60 |
| ◇◇ ILLUMINATION B | RETICLE7 | DATA 61 |
| ◇◇ ILLUMINATION C | RETICLE8 | DATA 62 |

EXPOSURE APPARATUS AND A METHOD OF MANUFACTURING A DEVICE THAT CONDUCT EXPOSURE USING A SET LIGHT SOURCE SHAPE

This application claims the benefit of Japanese Patent Application No. 2008-101815, filed Apr. 9, 2008, which is hereby incorporated by reference herein in its entirety.

BACKGROUND OF THE INVENTION

1. Field of the Invention

The present invention relates to an exposure apparatus and a method of manufacturing a device and, more particularly, to an exposure apparatus used in manufacturing a device such as a semiconductor device, an image sensing device, a liquid crystal device, or a thin-film magnetic head by lithography, and a method of manufacturing a device using the same.

2. Description of the Related Art

Recently, in the quest for smaller, thinner electronic devices, demands for advances in micropatterning of semiconductor devices mounted in the electronic devices are further growing. For example, the design rule is about to achieve the formation of a circuit pattern having a minimum feature size of 100 nm or less on mass production lines, and is expected to further shift to the formation of a circuit pattern having a minimum feature size of 80 nm or less in the future. A main stream processing technique for attaining such a strict design rule is photolithography. In photolithography, a projection exposure apparatus which projects and transfers a mask pattern drawn on a mask or reticle onto a wafer using a projection optical system has conventionally been employed.

A resolution R of the projection exposure apparatus is given by the Rayleigh equation:

$$R = k_1 \times \lambda / NA \quad (1)$$

where $\lambda$ is the wavelength of the light source, and NA is the numerical aperture of the projection optical system.

A depth of focus DOF, that is, the focal range within which a constant image forming performance can be maintained is given by:

$$DOF = k_2 \times \lambda / NA^2 \quad (2)$$

As the DOF decreases, focusing becomes more difficult. To overcome this difficulty, there is a demand to increase the substrate flatness and the focusing accuracy, and so, essentially, the DOF is desirably large.

The mask pattern includes, for example, a line and space (L & S) pattern having adjacent lines and spaces, a contact hole array having adjacent and periodical contact holes (i.e., contact holes arrayed at an interval equal to the hole diameter), an isolated contact hole which is not adjacent to, but isolated, and other isolated patterns. However, to transfer the pattern with a high resolution, it is necessary to select an optimum illumination condition in accordance with the type of pattern.

System chips manufactured by the modern semiconductor industry are shifting to those having a higher added value and a mixture of a wide variety of patterns. Under the circumstances, it has become necessary to fabricate a mask having a mixture of a plurality of types of contact hole patterns. However, it has been impossible to simultaneously transfer contact hole patterns each having a mixture of a contact hole array and an isolated contact hole, with a high resolution.

To combat this situation, various kinds of methods have been proposed for increasing the depth of focus by increasing the resolution limits of only a contact hole array and a two-dimensional repetitive interconnection pattern. An example of these methods is a phase shift method using a double exposure (or multiple exposure) scheme that separately forms, by exposure, different types of patterns using two masks, or a scheme that enhances the resolving power of a main pattern by providing various types of auxiliary patterns to the mask pattern. This method improves the resolving power by forming a thin film which guides the propagating light so that a portion of the conventional mask becomes 180° out of phase with its remaining part.

Unfortunately, various problems remain to be solved in order to improve the resolving power using a phase shift mask of a type that actually modulates the spatial frequency. Because of these problems, it is currently very difficult to manufacture semiconductor devices by actually using the phase shift mask.

A method commonly used at present exposes one mask under a special illumination condition. In contrast to vertical illumination as conventional illumination, this method obliquely applies light onto the reticle by adjusting the effective light source shape to an annular shape or a quadrupole shape, and is called modified illumination (off-axis illumination).

In conventional illumination, an image is formed by interference among three light beams: the 0th- and ±1st-order light beams. In this case, the ±1st-order light beams are distributed at positions, which are shifted by their diffraction angles from the optical axis, in the pupil plane, as shown in FIG. 4A. However, as shown in FIG. 4B, as the pattern becomes finer, the intervals between the 0-th and ±1st-order light beams widen, so a certain component of the diffracted light falls outside of the aperture stop of the projection lens. As a consequence, the 0th-order light beam can interfere with no light beam, and, therefore, no image can be formed.

In modified illumination, an image is formed by interference among two light beams: the 0th- and +1st-order light beams or the 0th- and −1st-order light beams, as shown in FIG. 5B. In this case, an angle θ between the optical axis and the diffracted light in modified illumination is narrower than that in conventional illumination shown in FIG. 5A. Using this fact, the incident angle in off-axis illumination is increased so that the 0th- and +1st-order light beams or the 0th- and −1st-order light beams barely fall within the pupil. With this operation, diffracted light that enters the pupil plane at a larger incidence angle can be received even when the lens NA remains the same. FIG. 6 is a view showing an example of the diffracted light distribution on the pupil plane in annular illumination. Even diffracted light that is shielded by the NA stop in conventional illumination, as shown in FIG. 7A, can be received in the pupil plane in modified illumination, as shown in FIG. 7B. It is, therefore, possible to ensure the contrast of even a fine pattern. That is, it is possible to effectively increase the lens NA. In addition, an angle θ between the optical axis and the diffracted light in modified illumination is narrower than that in conventional illumination, resulting in an increase in the DOF.

Annular illumination is suited to a repetitive dense pattern, so it is effective for general patterns in various directions. In practice, because it is necessary to optimize the annular ratio, as shown in FIGS. 3A and 3B, in accordance with the pattern pitch and direction, a function of continuously changing the outer σ is important.

The light source shape in quadrupole illumination, shown in FIG. 3C, is suited to a two-dimensional repetitive pattern. Quadrupole illumination uses a shape having one opening in each of the four quadrants with respect to the optical axis.

FIG. 8 is a schematic view showing the main portion of a scanning projection exposure apparatus using the conventional 1× mirror optical system (see Japanese Patent Laid-Open No. 2006-019412). The projection exposure apparatus shown in FIG. 8 includes a reflecting projection optical system R including a concave mirror 40, a convex mirror 41, and mirrors 39 and 42. The projection exposure apparatus also includes a mercury lamp power supply 21, an elliptical mirror 22, a shutter 23, condenser lenses 24 and 28, a wavelength filter 25, an integrator 26, a stop 27, a field stop 29, including an arcuate or fan-shaped aperture, and a relay system including a relay lens 30 and mirrors 31 and 32. The projection exposure apparatus also includes an illumination system I that forms an arcuate or fan-shaped illumination region on a mask 38.

The projection exposure apparatus includes a Kohler illumination system arranged such that a secondary light source plane formed by the integrator 26 nearly matches the focal point of the condenser lens 28 on its front side, and that the field stop 29 nearly matches the focal point of the lens 28 on its rear side.

The mask 38 is inserted in the object plane of the projection optical system R, and is driven in synchronism with a wafer 43 inserted in the image plane. The mask 38 and the wafer 43 are scanned by light in directions indicated by a double-headed arrow in FIG. 8, in the object plane and the image plane, respectively, thereby transferring a pattern formed on the mask 38 onto the wafer 43.

The illumination system I is required to uniformly and efficiently irradiate the effective image region (which typically has an arc or fan shape) of the projection optical system R on the mask 38 with a predetermined numerical aperture.

To attain this operation, the conventional illumination system superposes, on the field stop 29, illumination light beams from cylindrical fly-eye lenses used as integrators to temporarily form a rectangular irradiation region free from illuminance nonuniformity on the field stop 29. An image of the light beam that passes through an arcuate or a fan-shaped slit (aperture) formed in the field stop 29 is formed on the mask 38 by the relay system (image forming system), including the optical elements 30 to 32, to obtain illumination with a desired arc or fan shape and an illuminance that is uniform throughout all points in the irradiation region on the mask 38.

Conventionally, a mercury lamp or an excimer laser is used as a light source to illuminate an illumination target object or to expose an exposure target object. These light sources are very inefficient because most of the energy input to drive them turns into heat. Also, assume that projection exposure, in which the feature sizes and arrangements of a pattern having a contact hole array, a pattern having a mixture of an isolated contact hole and a contact hole array, and a mask pattern change for each process is performed on a processing target in, for example, photolithography. In this case, when modified illumination is necessary, exposure is performed by forming necessary illumination after selectively exchanging a stop for modified illumination as needed for a single light source. However, the number and types of stops have limitations, so it is impossible to freely change an illumination condition that exhibits the required function of the illumination optical system (more specifically, the effective light source distribution of the illumination optical system). This makes it impossible to perform exposure under an optimum illumination condition and therefore to obtain a high resolution. In addition, the production efficiency is poor because the stop requires replacement as the illumination condition is changed.

The conventional techniques often have a function of changing a normal circular effective light source to an annular effective light source, or a mechanism that switches to a quadrupole effective light source. However, to keep up with advances in micropatterning in the future, it is necessary to improve the resolving power by flexibly changing effective light source of even the same type.

Especially, in exposure that uses a mercury lamp as a light source, an exposure shutter plays a role of an exposure amount control unit. For this reason, the exposure time is limited by the driving time of such a mechanical shutter, so the throughput rate is controlled by the shutter opening/closing speed. This makes it hard to improve the throughput.

SUMMARY OF THE INVENTION

The present invention has been made in consideration of the above-described problems, and provides an exposure apparatus that can perform precise exposure control in every detail by controlling turning on and off of individual semiconductor light sources in accordance with the exposure pattern.

According to the present invention, an exposure apparatus is able to expose a substrate to light having a set light source shape via a mask, the apparatus comprising a plurality of light sources arrayed two-dimensionally, and a light source control unit configured to control turning on and off of each of the plurality of light sources by referring to data of illumination modes according to the light source shape.

According to the present invention, it is possible to perform precise exposure control in every detail by controlling turning on and off of individual semiconductor light sources in accordance with the exposure pattern.

Further features of the present invention will become apparent from the following description of exemplary embodiments with reference to the attached drawings.

BRIEF DESCRIPTION OF THE DRAWINGS

FIG. 5A is a view showing an angle θ between the optical axis and the diffracted light in conventional illumination;

FIG. 5B is a view showing an angle θ between the optical axis and the diffracted light in modified illumination;

FIG. 11 is a table showing an example of table data of illumination modes;

DESCRIPTION OF THE EMBODIMENTS

An exposure apparatus according to an embodiment of the present invention will be described below with reference to the accompanying drawings. However, the present invention is not particularly limited to this embodiment, and each constituent element can be alternatively substituted by another one within the scope in which the object of the present invention can be achieved.

Figure 9:
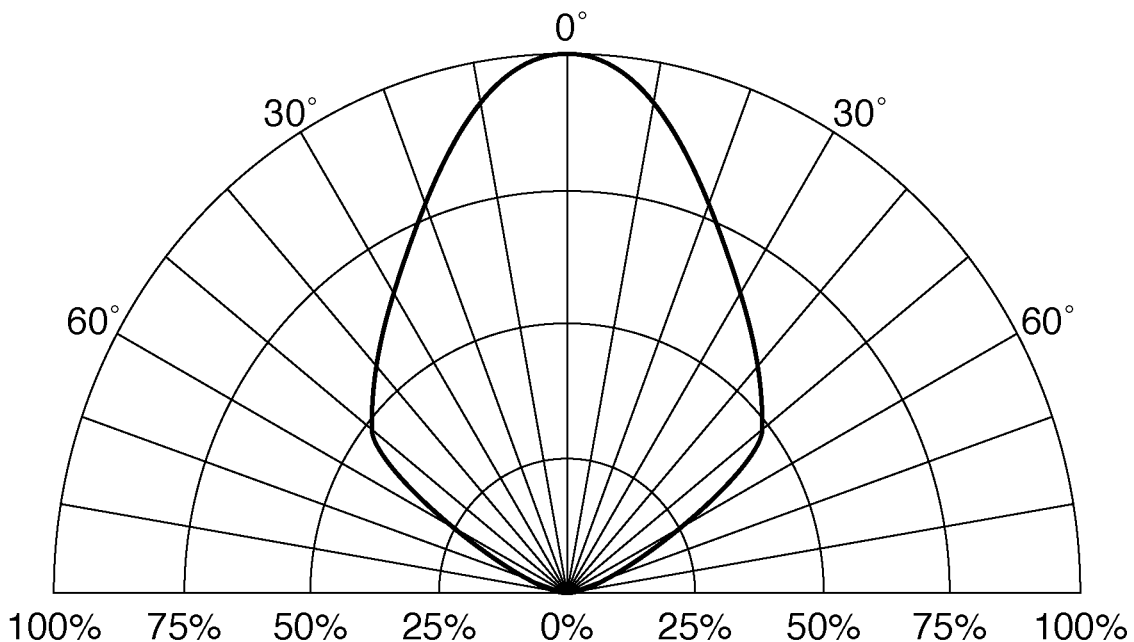
FIG. 9 is a graph showing the schematic shape of the light distribution of the i-line LED.
Figure 10:
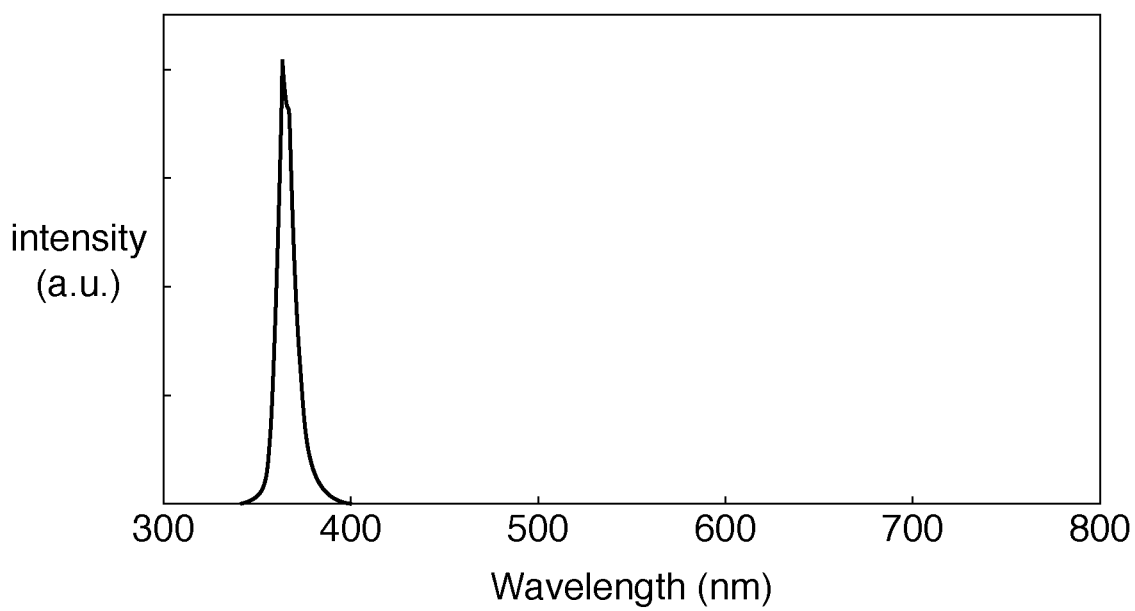
FIG. 10 is a graph showing the schematic shape of the wavelength distribution of the i-line LED.

The present invention achieves low-energy, high-performance illumination that can efficiently and uniformly irradiate an irradiation target object using a plurality of light sources, each having a relatively small energy emission. The light source in the present invention is a semiconductor light source, such as a light-emitting diode (LED) or a semiconductor laser (LD). An LED has a higher directivity for light emitted by each light source than does a mercury lamp, as shown in FIG. 9. The intensity is high near the center of the irradiation region, whereas it is low in the periphery of the irradiation region. Also, an LED has a waveform of a wavelength distribution of the light source close to a Gaussian distribution, as shown in FIG. 10. The use of optical integrators including lenses in one-to-one correspondence with the LED light sources (or LDs) allows efficient generation of secondary light sources.

Also, the present invention can achieve satisfactory pattern exposure on, for example, a substrate with a high throughput. To achieve this operation, according to the present invention, light beams are emitted by a light source including a plurality of semiconductor light sources arrayed two-dimensionally, are directly guided to optical integrators without any lenses, and are spatially split, thereby generating a large number of secondary light sources. The light beams from the generated large number of secondary light sources are superposed by a condenser lens and applied into the illumination target region.

A light source driver is connected to the semiconductor light sources, and issues turning on and off driving instructions so as to optimize the individual LEDs (or LDs) via a controller, in order to form a desired illuminance and illumination shape (light source shape). The controller has a function of generating an illumination shape profile and an illuminance profile necessary for exposure, based on the information of table data of illumination modes, and automatically controlling the energies of the individual light sources, so as to make the illumination light uniform. This function can easily, quickly form desired modified illumination without any aperture stop.

Controlling the output intensities and times of the individual semiconductor light sources using the controller allows hybrid exposure that simultaneously performs high-order exposure that requires modified illumination, and low-order exposure that requires cs illumination. This makes it possible to reduce the cost and the time to prepare, for example, a large number of masks and stops, and selectively exchange them as needed, in accordance with each mode.

The present invention is suitable for an illumination optical system that projects and transfers, by exposure, a pattern having a contact hole array or a pattern having a mixture of an isolated contact hole and a contact hole array onto a processing target in, for example, photolithography.

An embodiment of the present invention will be described in detail below with reference to the accompanying drawings.

Figure 1:
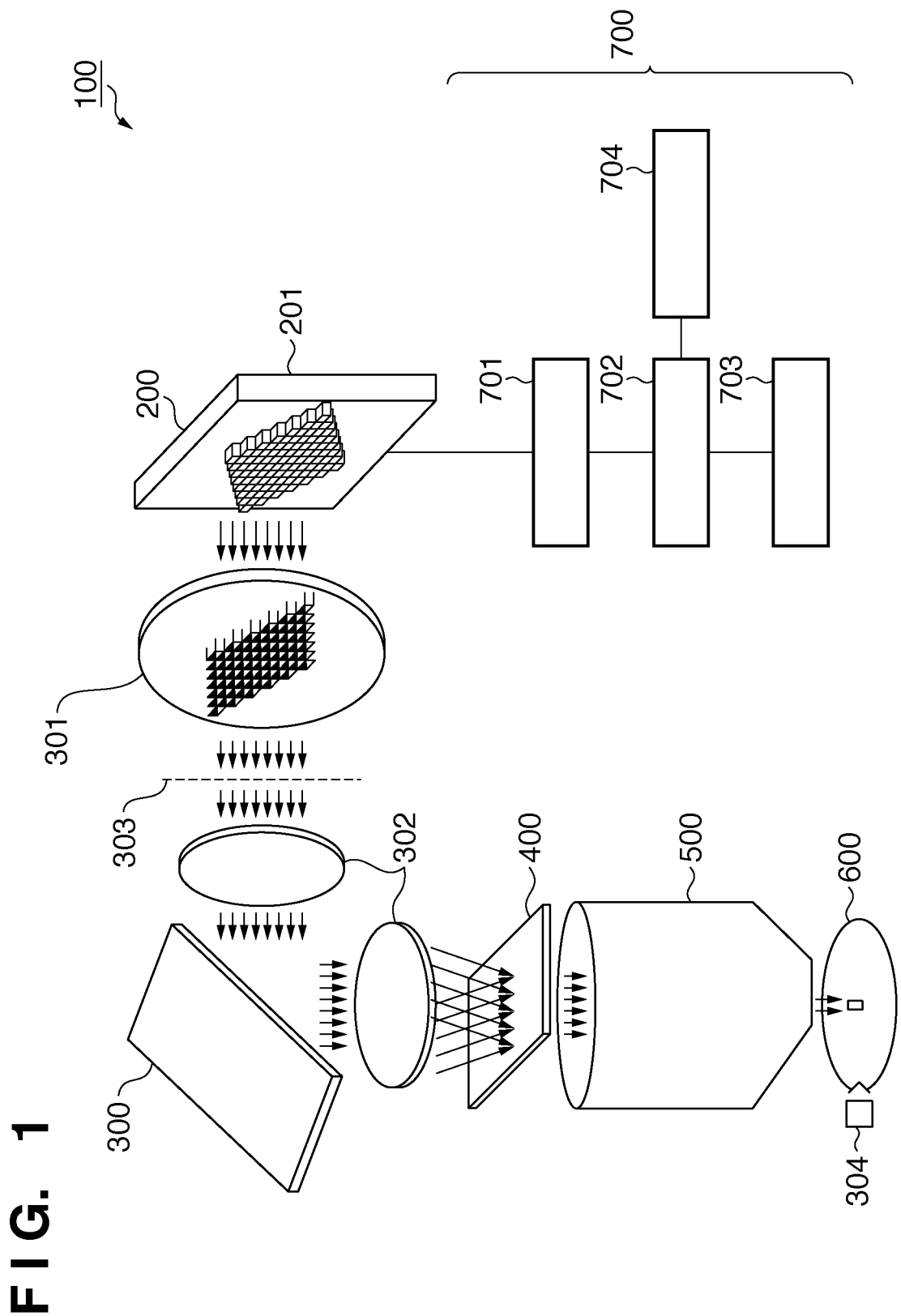
FIG. 1 is a schematic view showing an exposure apparatus using a large number of LEDs (or LDs) in a light source.

FIG. 1 is a schematic view exemplifying the arrangement of an exposure apparatus according to an embodiment of the present invention. An exposure apparatus 100 includes a light source 200, an illumination optical system 300, a mask (reticle) 400, a projection optical system 500, a substrate (plate or wafer) 600, and a light source control unit 700.

The exposure apparatus 100 is a projection exposure apparatus that transfers a circuit pattern (set exposure pattern) formed on the mask 400 onto the substrate 600 by exposure using, for example, the step and repeat scheme or the step and scan scheme. An exposure apparatus of this type is best suited to submicron lithography. This embodiment will exemplify an exposure apparatus of the step and scan scheme (also called a "scanner"). Note that the "step and scan scheme" means herein an exposure method of transferring a mask pattern (exposure pattern) onto the substrate 600 by exposure by continuously scanning the substrate 600 with respect to the mask 400, and moving the substrate 600 to the exposure region of the next shot step by step after the end of one-shot exposure. Note also that the "step and repeat scheme" means herein an exposure method of moving the substrate 600 to the exposure region of the next shot step by step for each full-plate exposure of the shots on the substrate 600.

The light source 200 is configured by two-dimensionally arraying, for example, 200 LEDs (e.g., the i-line having a wavelength of 375 nm and an output of 200 mW) serving as semiconductor light sources, and forms a two-dimensional light source shape. However, the types and number of LEDs (or LDs) are not particularly limited. LED elements can be GaAs, GaAlAs, GaP/GaP, or GaAlAs/GaAs. Alternatively, LED elements, which have various emission wavelengths, such as InGaAlP, InGaAlP/GaP, InGaAlP/GaAs, InGaAlP/GaAs, AlInGaN, AlGaN, InGaN, GaN, AlN, ZnO, ZnSe, and diamond may be used. Although not particularly limited, LED elements, which have emission wavelengths suited to resist exposure, such as AlInGaN, AlGaN, and InGaN, can also be used.

Figure 2A:
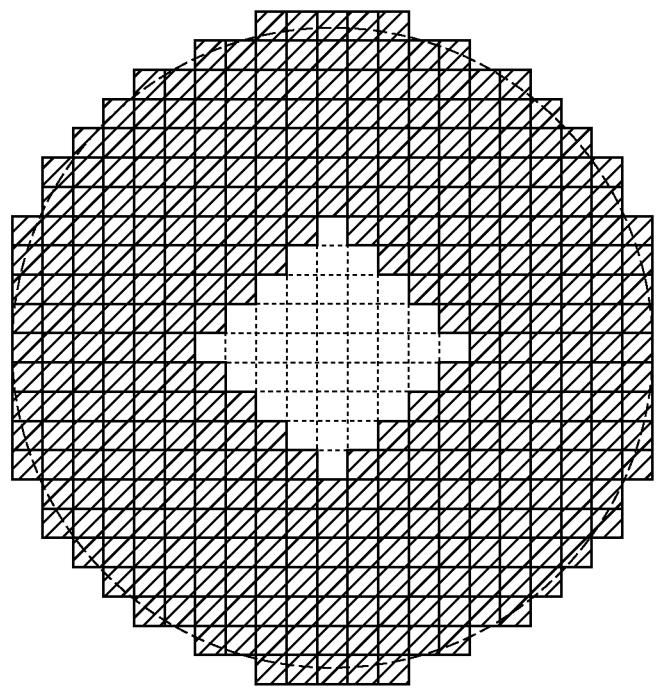
FIG. 2A is a view showing the light source shape in conventional low-σ illumination.
Figure 2B:
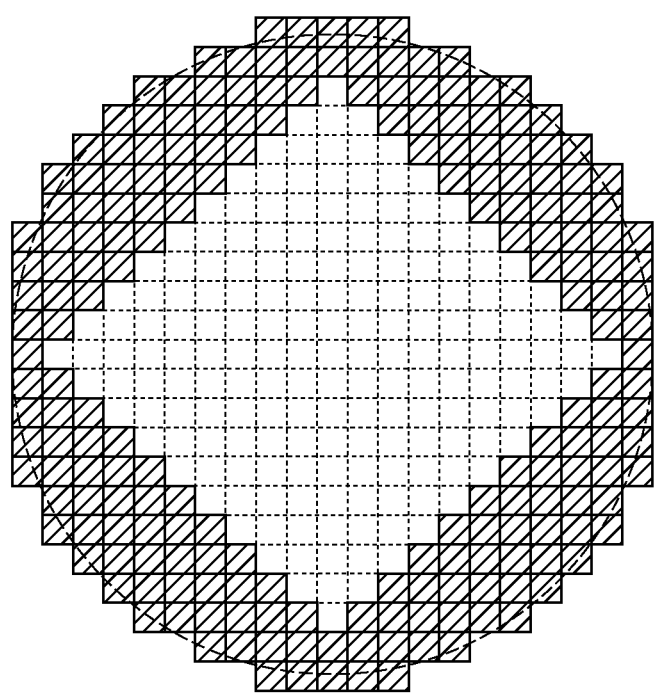
FIG. 2B is a view showing the light source shape in conventional high-σ illumination.
Figure 3A:
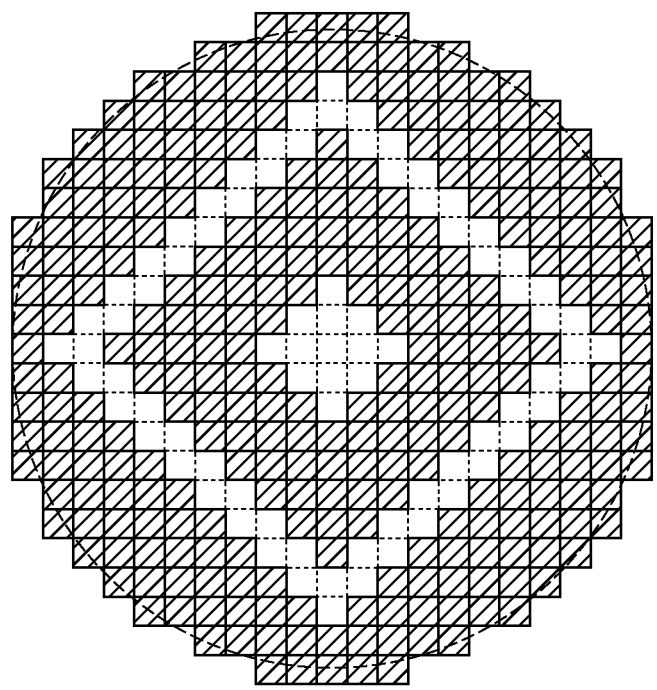
FIG. 3A is a view showing the light source shape in annular illumination.
Figure 3B:
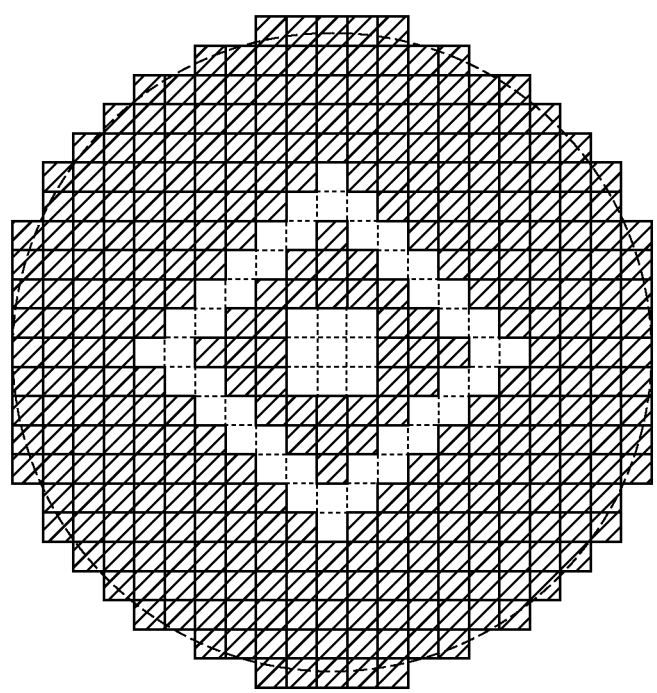
FIG. 3B is a view showing the light source shape in illumination in which the annular ratio is variable.
Figure 3C:
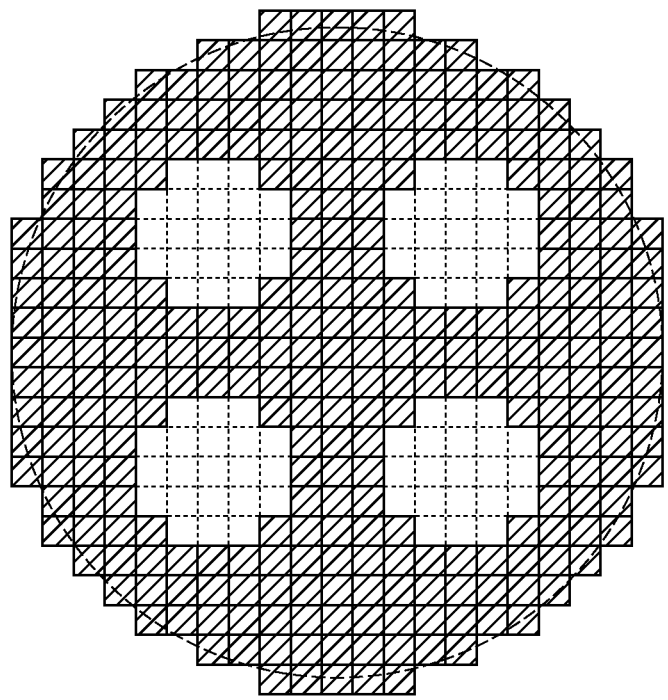
FIG. 3C is a view showing the light source shape in quadrupole illumination.
Figure 3D:
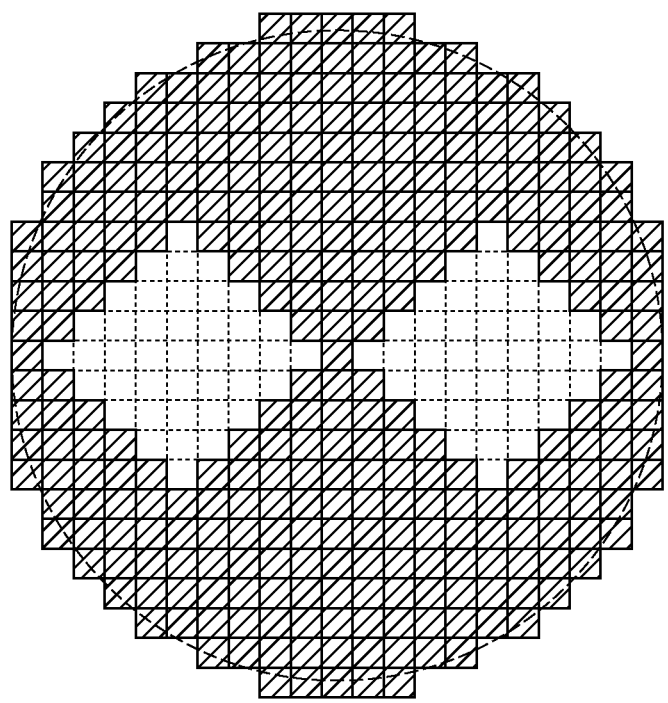
FIG. 3D is a view showing the light source shape in dipole illumination.
Figure 4A:
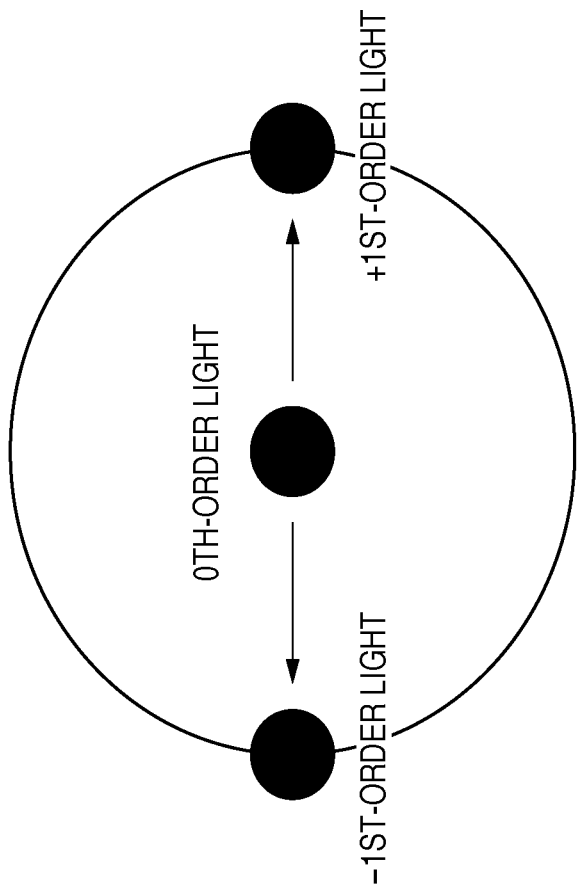
FIG. 4A is a view showing the light distribution on the pupil plane in conventional illumination.
Figure 4B:
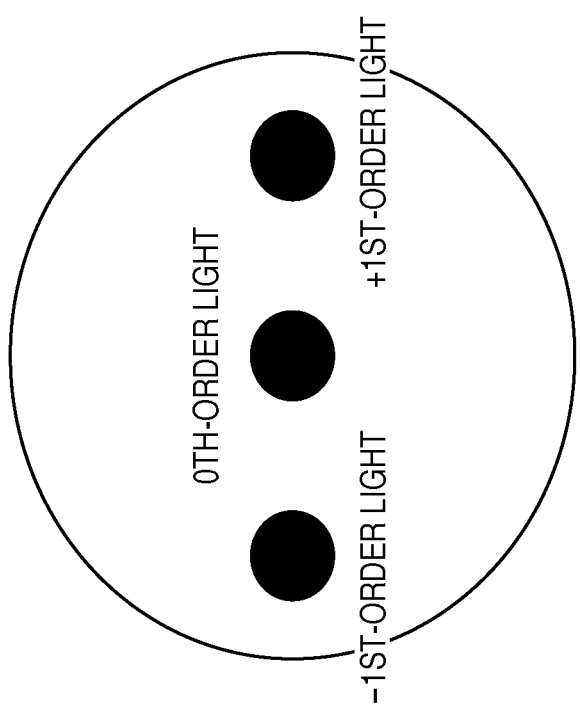
FIG. 4B is a view showing the light distribution on the pupil plane in conventional illumination.
Figure 6:
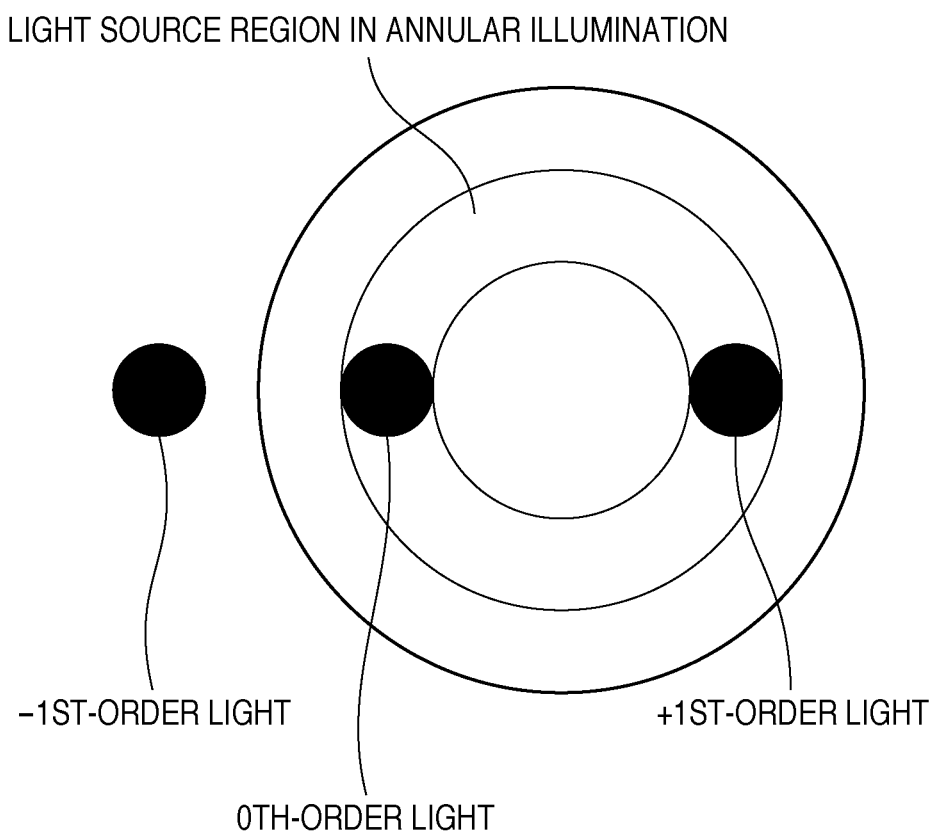
FIG. 6 is a view showing an example of the diffracted light distribution on the pupil plane in annular illumination.
Figure 7A:
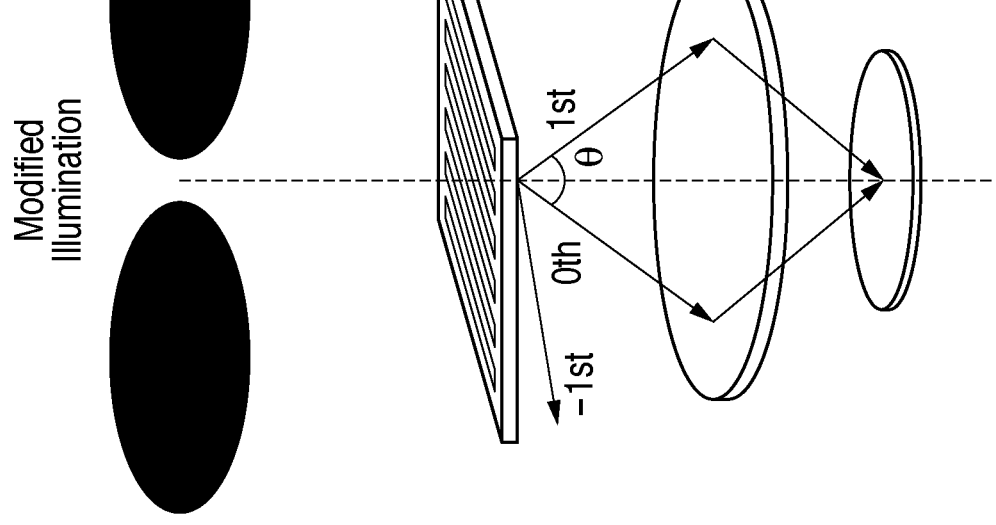
FIG. 7A is a view showing an angle θ between the optical axis and the diffracted light in conventional illumination during exposure.
Figure 7B:
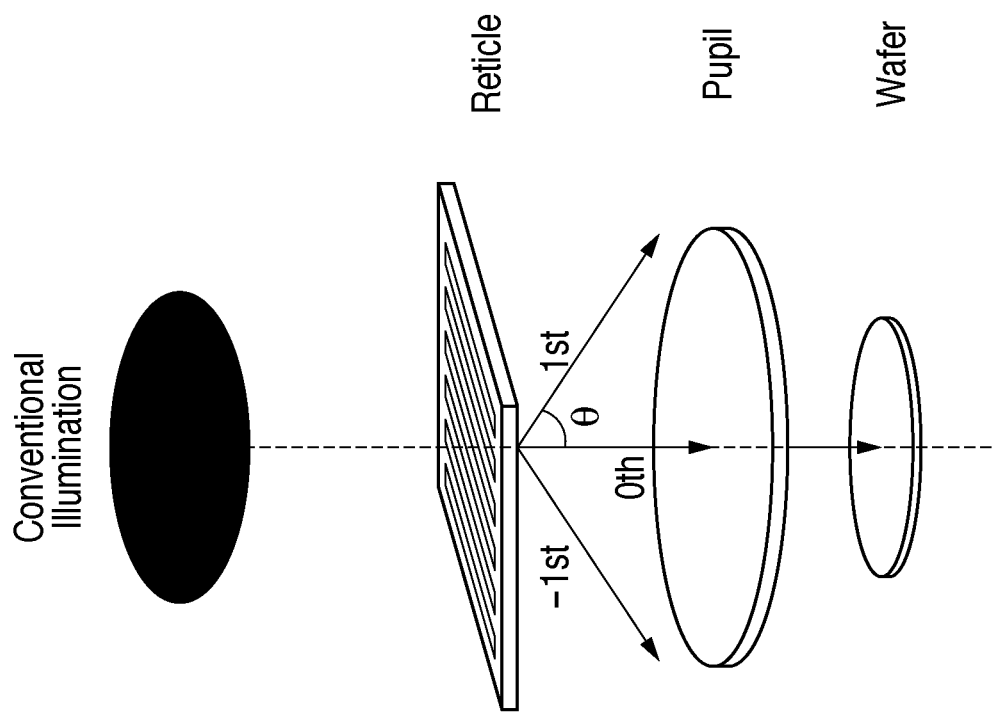
FIG. 7B is a view showing an angle θ between the optical axis and the diffracted light in modified illumination during exposure.
Figure 8:
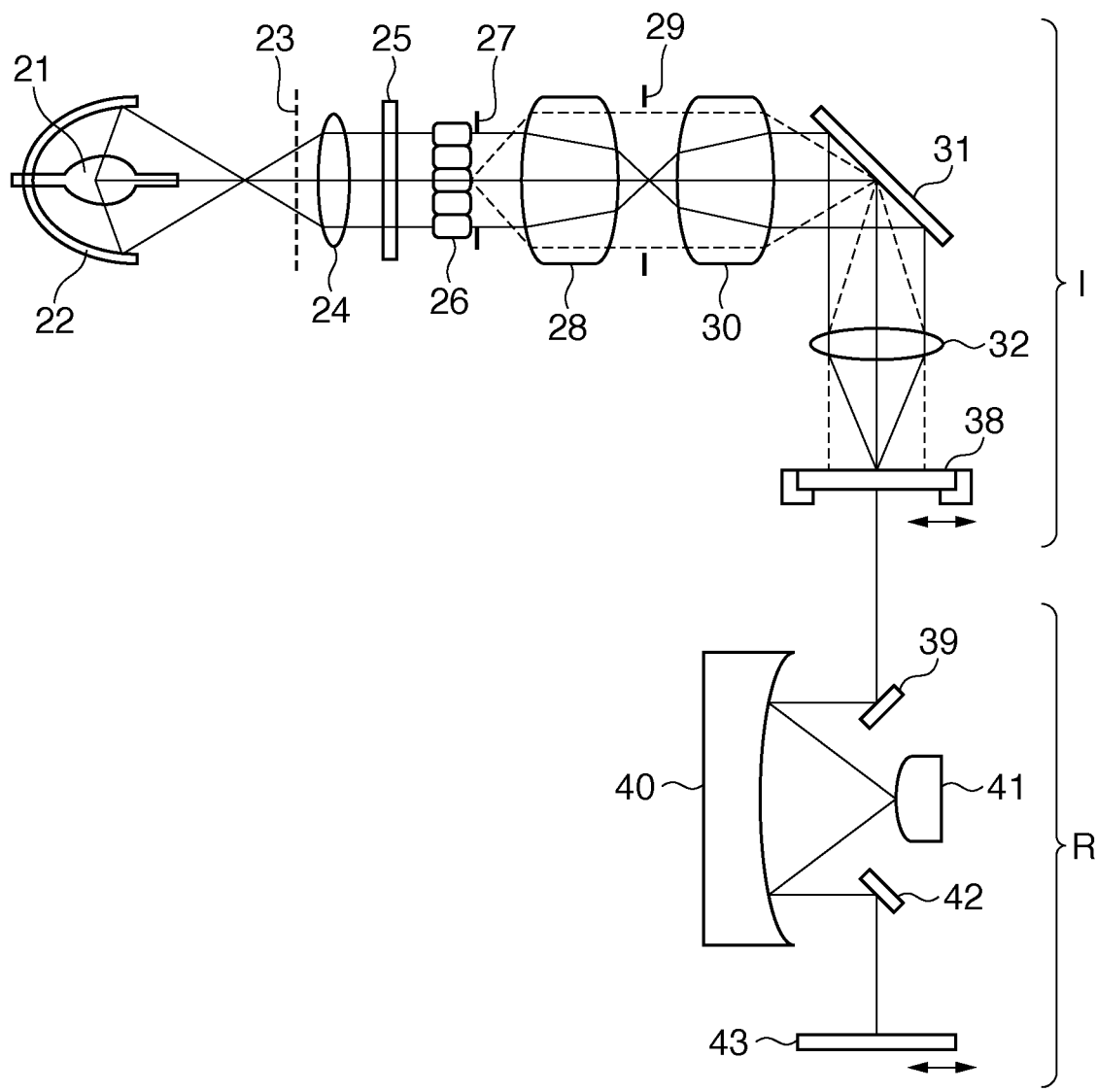
FIG. 8 is a view showing an example of a scanning projection exposure apparatus using the conventional 1× mirror optical system.

The light source control unit 700 is connected to LEDs (or LDs) 201 of the light source 200. The light source control unit 700 includes a light source driver 701 for the LEDs (or LDs), a controller 702 for determining turning on and off of each LED, table data of illumination modes 703, which stores the information of illumination modes, and a console 704 manipulated by the operator. An illumination mode necessary for exposure is designated based on the recipe selected via the console 704, or an identifying mark (identifier), which is formed on the mask 400 and used to designate an illumination mode. As an illumination mode is designated, the exposure pattern is determined by referring to the table data of illumination modes 703. Then, the controller 702 outputs turning on and off driving instructions to the light source driver 701 in accordance with the turning on and off information of each LED, which is invoked from the table data of illumination modes 703. With this operation, two-dimensional light source shapes, such as light source shapes 800, in normal illumination, shown in FIGS. 2A and 2B, and light source shapes in modified illumination, shown in FIGS. 3A to 3D, are formed. FIG. 3A shows the light source shape in annular illumination, FIG. 3B shows the light source shape in illumination in which the annular ratio is variable, FIG. 3C shows the light source shape in quadrupole illumination, and FIG. 3D shows the light source shape in dipole illumination. In addition, the information obtained by an illuminance distribution measurement sensor 304 is sent to the light source control unit 700. The light source control unit 700 generates a profile for adjusting the output intensities of the individual LEDs so as to correct, for example, illuminance nonuniformity attributed to optical elements, and controls the outputs of the individual LEDs (or LDs).

The illumination optical system 300 includes optical integrators 301 in a number equal to that of LEDs (or LDs) of the light source, and a condenser lens 302. The optical integrators 301 form secondary light sources 303 by diverging linear light beams emitted by the individual LEDs (or LDs). The condenser lens 302 is arranged at an optimum position to attain a high converging efficiency and uniformity.

Because light sources are superposed by a condenser lens, and serve as independent light source LEDs (or LDs), a delay in emission timing occurs between these light sources. Hence, the light beams used are converted into spatially incoherent light beams to prevent the generation of any speckles.

The total exposure amount is measured as needed by the illuminance distribution measurement sensor 304. When the total exposure amount has reached a prescribed exposure amount, the light source control unit 700 issues a turning off instruction to the LEDs (or LDs). The fact that an LED (or LD) has good response characteristics obviates the need for any mechanical shutter. This makes it possible to achieve exposure with a precisely controlled exposure amount. Moreover, since an LED (or LD) has good turning on and off response characteristics, the throughput is expected to improve along with an increase in the resist sensitivity and improvements in the illuminances of light source LEDs (or LDs) in the future.

Figure 12A:
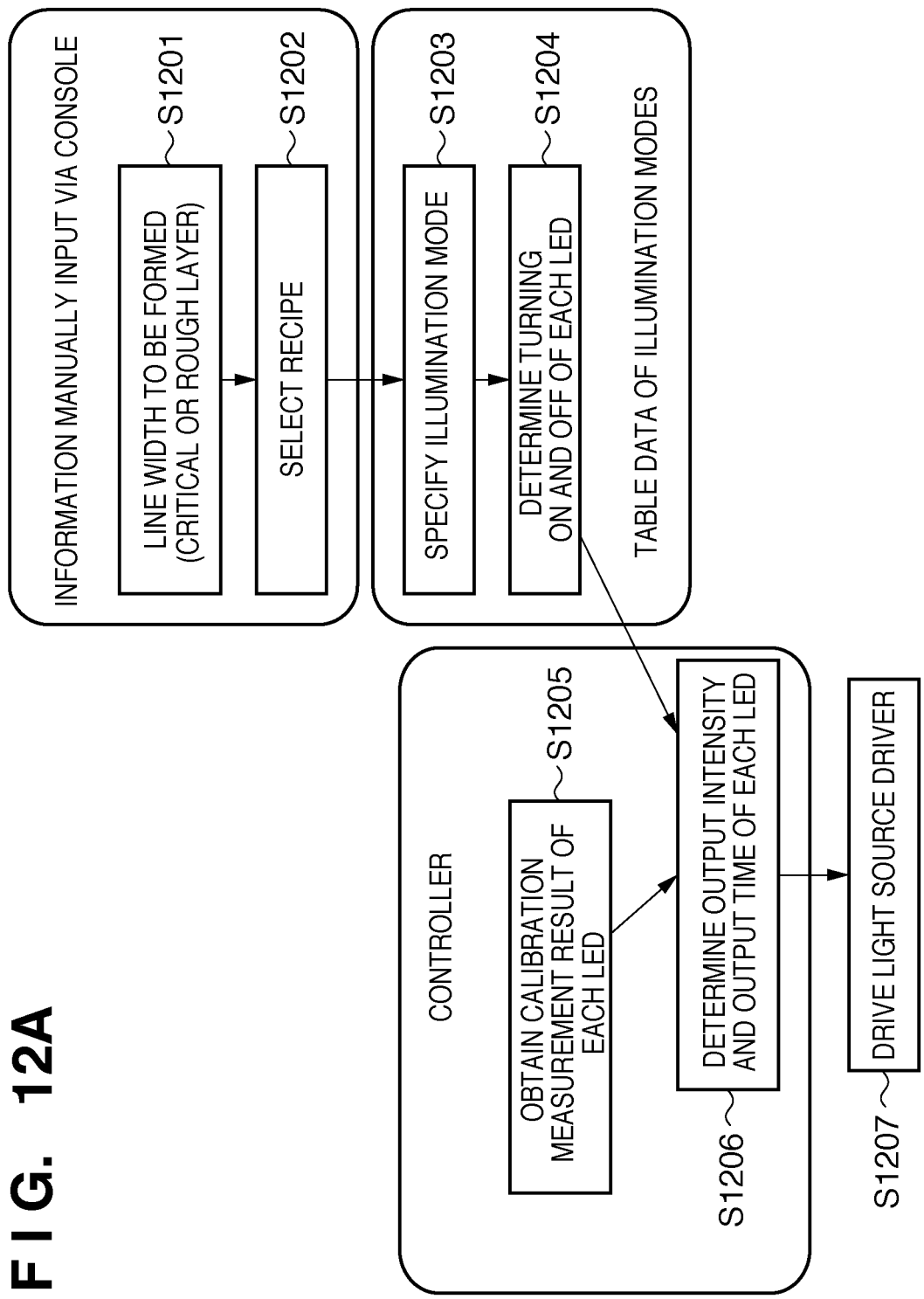
FIG. 12A is a flowchart illustrating a sequence of driving a light source driver.
Figure 12B:
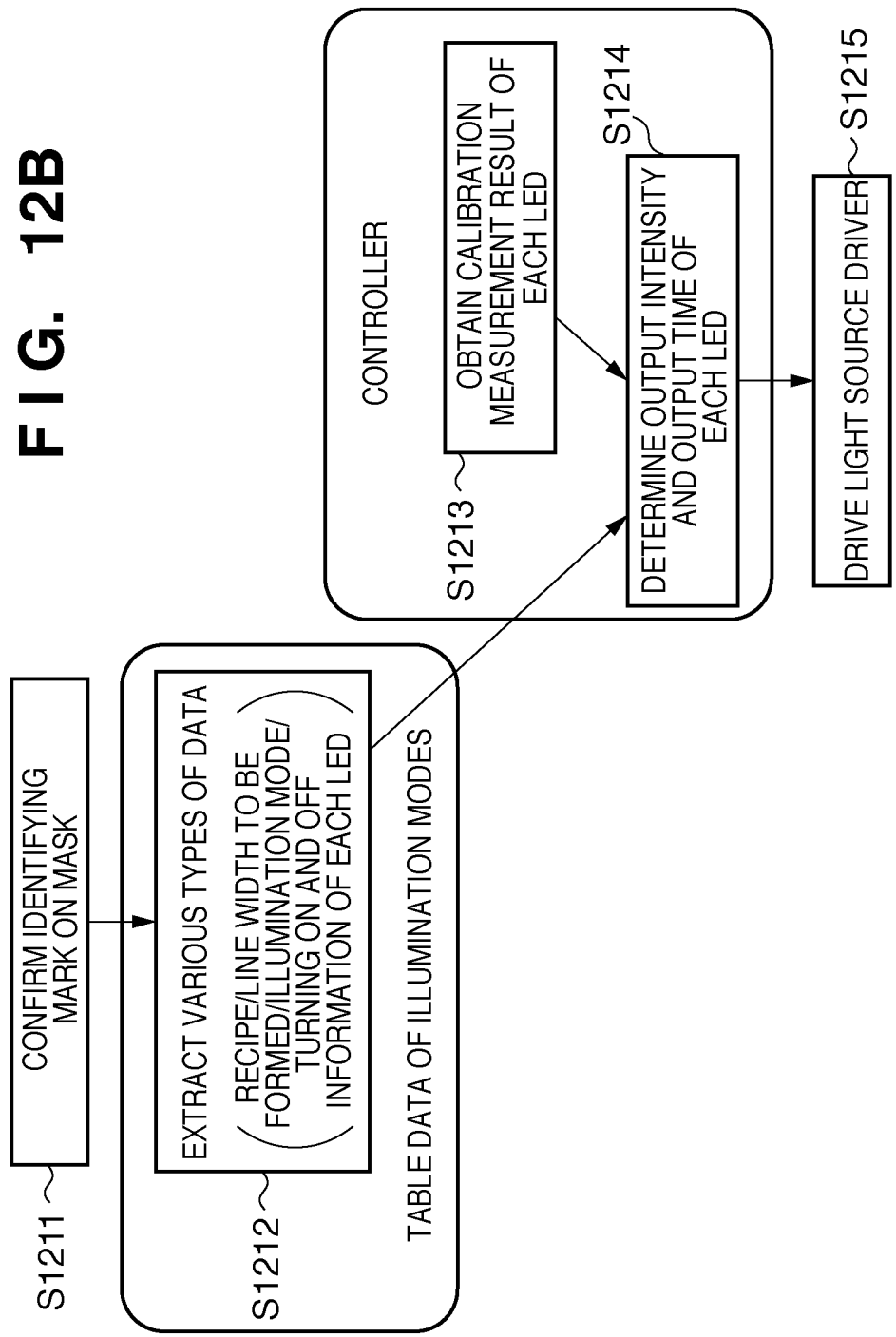
FIG. 12B is a flowchart illustrating another sequence of driving the light source driver.

FIGS. 12A and 12B explain actual exposure sequences based on the above-mentioned features of the present invention. FIG. 12A shows a method of driving the light source driver 701 in accordance with the information manually input from the console 704. FIG. 12B shows a method of driving the light source driver 701 in accordance with the identifying mark on the mask 400.

A case in which the light source driver 701 is driven in accordance with the information manually input from the console 704 will be explained first with reference to FIG. 12A.

In step S1201, the user inputs a line width (critical layer or rough layer) to be formed via the console 704 in the light source control unit 700.

In step S1202, the user selects a recipe via the console 704 in the light source control unit 700.

In step S1203, the controller 702 in the light source control unit 700 specifies an illumination mode by referring to the table data of illumination modes, shown in FIG. 11, in accordance with the recipe selected in step S1202.

In step S1204, the controller 702 in the light source control unit 700 extracts, from the table data of illumination modes, data on LED turning on and off driving instructions corresponding to the illumination mode (light source shape) specified in step S1203. With this operation, the controller 702 in the light source control unit 700 determines turning on and off of each LED 201.

In step S1205, the illuminance distribution measurement sensor 304 measures the characteristics of the input current and brightness output of each LED, and saves these characteristics in the light source control unit 700. Deviations of the measurement results from predicted values are confirmed, calibration is performed periodically, and the output intensity and output time of each LED are corrected. This allows high-precision exposure. Step S1205 need not be performed every time this sequence is executed. The characteristic of the input current of each LED may be predicted from its deterioration characteristic with respect to the use time of each LED, and the input current value may be changed based on the predicted value.

In step S1206, the controller 702 in the light source control unit 700 outputs turning on and off driving instructions of each LED to the light source driver 701 based on the characteristics of each LED obtained in step S1205, and the determination result obtained in step S1204. Then, the light source driver 701 is driven in step S1207.

A case in which the light source driver 701 is driven in accordance with the identifying mark on the mask 400 will be explained next with reference to FIG. 12B.

In step S1211, the controller 702 in the light source control unit 700 confirms the identifying mark (identifier) formed on the mask 40 to expose the substrate.

In step S1212, the controller 702 in the light source control unit 700 extracts various types of data from the table data of illumination modes, shown in FIG. 11, based on the identifying mark confirmed in step S1211. The various types of data include the recipe, the line width to be formed, the illumination mode, and the turning on and off information of each LED. Turning on and off of each LED 201 are determined, as in the case shown in FIG. 12A.

In step S1213, the characteristics of the input current and brightness output of each LED are measured, as in step S1205.

In step S1214, the controller 702 in the light source control unit 700 outputs turning on and off driving instructions of each LED to the light source driver 701 based on the characteristics of each LED obtained in step S1213, and the determination result obtained in step S1212. Then, the light source driver 701 is driven in step S1215.

In the afore-described way, the light source control unit 700 can control the LEDs (or LDs) of the illumination light source. This makes it possible to flexibly form a shape (light source shape) in modified illumination and to change the illumination mode during one exposure. This also allows hybrid exposure that simultaneously performs high- and low-order exposure operations.

Application Example

An embodiment of a method of manufacturing a device using the afore-described exposure apparatus will be explained next.

Devices (e.g., a semiconductor integrated circuit device and a liquid crystal display device) are manufactured by an exposure step of exposing a substrate using the exposure apparatus according to the above-mentioned embodiment, a development step of developing the substrate exposed in the exposure step, and other known steps (e.g., etching, resist removal, dicing, bonding, and packaging steps) of processing the substrate developed in the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus that exposes a substrate via a mask, the apparatus comprising:
   (a) a plurality of light sources arrayed two-dimensionally and configured to form a plurality of illumination modes to illuminate the mask;
   (b) a projection optical system configured to project a pattern of the mask illuminated by the plurality of light sources on the substrate; and
   (c) a light source control unit configured to control driving of each of said plurality of light sources, said light source control unit comprising:
      (i) a light source drive configured to drive each of said plurality of light sources;
      (ii) a storage unit configured to store driving information of a plurality of illumination modes of each of said plurality of light sources;
      (iii) a console configured to designate an illumination mode from the plurality of illumination modes based on an exposure recipe; and
      (iv) a controller configured to invoke driving information of each of said plurality of light sources from the storage unit in accordance with the illumination mode designated by said console, and to issue turning on and off driving instructions to said light source drive, so that said plurality of light sources form the illumination mode designated by said console.

2. The apparatus according to claim 1, wherein said controller adjusts the output from each of said plurality of light sources.

3. The apparatus according to claim 1, wherein said controller determines an illumination mode based on an identifying mark formed on the mask.

4. A method of manufacturing a device, the method comprising:
   (A) exposing a substrate via a mask using an exposure apparatus;
   (B) developing the substrate exposed in said exposing step; and
   (C) processing the substrate developed in said developing step, to manufacture the device,
   wherein the exposure apparatus includes:
   (a) a plurality of light sources arrayed two-dimensionally and configured to form a plurality of illumination modes to illuminate the mask;
   (b) a projection optical system configured to project a pattern of the mask illuminated by the plurality of light sources on the substrate; and
   (c) a light source control unit to control driving of each of the plurality of light sources, the source control unit comprising:
      (i) a light source drive configured to drive each of the plurality of light sources,
      (ii) a storage unit configured to store driving information of a plurality of illumination modes of each of the plurality of light sources,
      (iii) a console configured to designate an illumination mode from the plurality of illumination modes based on an exposure recipe, and
      (iv) a controller configured to invoke driving information of each of the plurality of light sources from the storage unit in accordance with the illumination mode designated by the console, and to issue turning on and off driving instructions to the light source drive, so that the plurality of light sources form the illumination mode designated by the console.

5. The apparatus according to claim 1, further comprising a sensor configured to measure illuminance from said plurality of light sources, wherein the controller issues a driving instruction to the light source drive when a total exposure amount has reached a predetermined amount based on a measurement result of the sensor.

6. The method according to claim 4, wherein the controller adjusts the output from each of the plurality of light sources.

7. The method according to claim 4, wherein the controller determines an illumination mode based on an identifying mark formed on the mask.

8. The method according to claim 4, wherein the light source control unit further comprises a sensor configured to measure illuminance from the plurality of light sources, and the controller issues a driving instruction to the light source drive when a total exposure amount has reached a predetermined amount based on a measurement result of the sensor.

9. The method according to claim 1, wherein (i) the light source control unit controls driving on and off of each of said plurality of light sources, (ii) the storage unit stores driving on and off information of the plurality of illumination modes, and (iii) the controller invokes driving on and off information of each of said plurality of light sources from the storage unit in accordance with the illumination mode designated by said console, and issues driving on and off driving instructions to said light source drive.

10. An exposure apparatus that exposes a substrate via a mask, the apparatus comprising:
   (a) a plurality of light sources arrayed two-dimensionally and configured to form a plurality of illumination modes to illuminate the mask; and
   (b) a light source control unit configured to control driving of each of said plurality of light sources, said light source control unit comprising:
      (i) a light source drive configured to drive each of said plurality of light sources;
      (ii) a storage unit configured to store driving information of a plurality of illumination modes of each of said plurality of light sources;
      (iii) a console configured to designate an illumination mode from the plurality of illumination modes based on an exposure recipe; and
      (iv) a controller configured to invoke driving information of each of said plurality of light sources from the storage unit in accordance with the illumination mode designated by said console, and to issue turning on and off driving instructions to said light source drive, so that said plurality of light sources form the illumination mode designated by said console.

* * * * *